United States Patent
Kim

(10) Patent No.: US 8,299,866 B2
(45) Date of Patent: Oct. 30, 2012

(54) METHOD AND DEVICE INCLUDING SIGNAL PROCESSING FOR PULSE WIDTH MODULATION

(75) Inventor: Bong Joo Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1195 days.

(21) Appl. No.: 12/115,718

(22) Filed: May 6, 2008

(65) Prior Publication Data

US 2008/0278209 A1 Nov. 13, 2008

(51) Int. Cl.
*H03K 7/08* (2006.01)
(52) U.S. Cl. ...... 332/109; 330/10; 330/207 A; 330/251; 381/120
(58) Field of Classification Search .......... 330/10, 330/251, 207 A, 260; 332/109; 381/120
See application file for complete search history.

(56) References Cited

U.S. PATENT DOCUMENTS

| | | | |
|---|---|---|---|
| 6,246,220 B1 | 6/2001 | Isham et al. | |
| RE38,487 E | 4/2004 | Isham et al. | |
| RE38,940 E | 1/2006 | Isham et al. | |
| 7,001,697 B2 | 2/2006 | Park et al. | |
| 7,241,539 B2 | 7/2007 | Kim et al. | |
| 7,250,745 B2 | 7/2007 | Yasukouchi et al. | |
| 7,439,801 B2 * | 10/2008 | Higuchi et al. | ......... 330/10 |
| 2007/0054638 A1 | 3/2007 | Song | |

FOREIGN PATENT DOCUMENTS

| | | |
|---|---|---|
| DE | 10346561 A1 | 4/2004 |
| DE | 102004057180 A1 | 7/2005 |
| JP | 2004-072707 | 3/2004 |
| JP | 2004-179945 | 6/2004 |
| JP | 2006-238293 | 9/2006 |
| KR | 95-26018 | 9/1995 |
| KR | 1020010030203 A | 4/2001 |
| KR | 1020050123034 A | 12/2005 |
| KR | 1020070027235 A | 3/2007 |

* cited by examiner

*Primary Examiner* — Arnold Kinkead
(74) *Attorney, Agent, or Firm* — Volentine & Whitt, PLLC

(57) ABSTRACT

A method and system process a signal for PWM modulation. An amplitude control signal adjusts the amplitude of an input signal, and an offset is added to the amplitude-adjusted signal to produce an offset-adjusted signal. The offset is selected according to the amplitude adjustment applied to the input signal. The offset-adjusted signal is pulse-width modulated the to produce a pulse-width modulated signal, and the pulse-width modulated signal is filtered to reduce high frequency components thereof.

36 Claims, 18 Drawing Sheets

METHOD AND DEVICE INCLUDING SIGNAL PROCESSING FOR PULSE WIDTH MODULATION

CROSS-REFERENCES TO RELATED APPLICATIONS

This application claims priority under 35 U.S.C. §119 from Korean Patent Application 10-2007-0045141, filed on 9 May 2007 in the name of Bong Joo Kim, the entirety of which is hereby incorporated by reference for all purposes as if fully set forth herein.

BACKGROUND AND SUMMARY

1. Field

This invention pertains to the field of pulse width modulation (PWM) and devices, such as audio amplifiers, that process data signals using PWM.

2. Description

A switching amplifier, or class-D amplifier, is an electronic amplifier where the active devices (especially in the output stage) are operated in on/off mode (i.e., as switches). FIG. 1 shows a block diagram of one embodiment of a class-D amplifier 100 for processing an analog input signal. Amplifier 100 includes triangular wave generator 120, comparator 140, switching controller 160, and low pass filter 180. The output of amplifier 100 is provided to a relatively fixed load (e.g., a loudspeaker 10, which typically might have an impedance of 8 ohms).

Amplifier 100 employs pulse width modulation (PWM) to convey the information of the analog input signal (e.g., an audio signal). The input signal is converted to a sequence of pulses whose average value is directly proportional to the amplitude of the signal at that time. The frequency of the pulses is typically ten or more times the highest frequency of interest in the input signal. The output signal produced by switching controller 160 consists of a train of pulses whose width is a function of the amplitude & frequency of the input signal being amplified, and hence amplifier 100 is also called a PWM amplifier. The output signal from switching controller 160 is filtered by low pass filter 180 to remove the aforementioned high frequency components of the pulses. PWM amplifier 100 feeds a varying audio signal voltage into loudspeaker 10.

The output signal contains, in addition to the required amplified input signal, unwanted spectral components (i.e. the pulse frequency and its harmonics) that must be removed by low pass filter 180. Low pass filter 180 is typically fabricated using (theoretically) lossless components like inductors and capacitors in order to maintain efficiency.

FIG. 2 is a functional block diagram of one embodiment of a PWM amplifier 200. PWM amplifier 200 includes a volume control block 210, an oversampler 220, a Delta-Sigma modulator 230, a PWM mapper 240, and a filter 250.

In contrast to amplifier 100 in FIG. 1, PWM amplifier 200 operates with a digital audio input signal. It must be noted that all real world audio signals are continuous-time analog signals. Therefore, sampling and quantization must be applied to convert the continuous-time analog signal to a discrete-time digital representation for use with PWM amplifier 200.

PWM amplifier 200 receives at its input a digital audio signal as pulse-code modulated data PCM_DATA, and receives a volume control signal VOL_CON, and outputs an amplified output signal AUD_OUT. PCM is a digital representation of an analog signal where the magnitude of the signal is sampled regularly at uniform intervals, then quantized to a series of symbols in a digital (usually binary) code.

Volume control block 210 includes a volume table 211 and a multiplier 215. Volume table 211 stores in a memory volume data VOL_DATA corresponding to each value of VOL_CON. VOL_DATA is a digital code (e.g. if VOL_CON is 4-bit data→Volume Table stores 16 values for VOL_DATA). In operation, volume table 211 receives the volume control signal VOL_CON and in response thereto generates a corresponding value for VOL_DATA which it outputs as the Volume. The value of Volume is then applied to multiplier 215 in order to adjust the level of PCM_DATA to output a volume-controlled audio signal VD.

FIG. 3 illustrates a block diagram of oversampler 300 which is one possible embodiment of oversampler 220. Oversampler 300 includes a first sampler operating at a frequency Fs, a low pass interpolation filter, and a second sampler operating at a much higher frequency (e.g., 64 Fs) that the first sampler. In signal processing, oversampling is the process of sampling a signal with a sampling frequency significantly higher than twice the bandwidth or highest frequency of the signal being sampled. Oversampling reduces quantization noise and increases resolution. Oversampler 220 oversamples the volume-controlled audio signal VD which is the output by volume control block 210 and outputs an oversampled signal DSM_IN.

FIG. 4 illustrates a block diagram of Delta Sigma Modulator 400 which is one possible embodiment of Delta Sigma Modulator 230. Delta Sigma Modulator 400 includes summer 410, loop filter 420, and quantizer 430. Loop filter 420 performs noise shaping by moving the quantization noise to higher frequencies which the ear can't hear. Quantizer 430 requantizes the signal output by loop filter 420. The output of quantizer 430 is fed back to summer 410 quantizer 430 for quantization noise reduction.

Delta Sigma Modulator 230 quantizes the oversampled signal DSM_IN to produce an output signal DSM_OUT having a fewer number of bits. With current technology (e.g., a system clock of 100~200 MHz), one can not make a PWM pulse of high resolution (e.g. 16 bits), so it needs to be requantized to a smaller number of bits (e.g. 4~5 bits) by Delta-Sigma Modulator 230.

PWM mapper 240 receives the PCM signal DSM_OUT and in response thereto produces and outputs a PWM signal. PWM mapper 140 modulates the width of the pulse in the PWM signal in proportion to the volume of the input signal DSM_OUT. PWM uses a square wave whose duty cycle is modulated resulting in the variation of the average value of the waveform. FIG. 5 illustrates an operation of PWM mapper 140 in the case where a three-bit PCM signal is converted to a one-bit PWM signal.

Low Pass Filter (LPF) 250 is a filter that passes low frequency signals (i.e., the required amplified signal) and removes unwanted spectral components (i.e., signals at the pulse frequency). Beneficially, LPF 250 is made with theoretically lossless components like inductors and capacitors.

A properly designed class-D amplifier offers the following benefits: small size and weight; low power (heat) a dissipation and hence a small heatsink requirements (or no heatsink at all); low cost due to the small heat sink requirements and compact circuitry; and very high power conversion efficiency, usually ≧90%.

Hereinafter, the current which is consumed by transferring the amplified signal to the speaker is called "dynamic current" and the current which is consumed by low pass filter filtering the unwanted spectral components is called "static current."

The total current that the PWM amplifier consumes is the sum of the dynamic current and the static current.

FIG. 6 illustrates the relationship between the static current and the total current consumption in the conventional PWM amplifier. As can be seen in FIG. 6, when the amplitude of the signal (i.e., the volume of an audio signal) is at its maximum value, then the load current (i.e. the dynamic current) which is passed by the low pass filter and transferred to the load (i.e., the loudspeaker) is the greatest portion of the total current consumption of the amplifier. But as the amplitude of the signal decreases, then the total current consumption decreases while the static current consumed in the low pass filter increases so as eventually to be in excess of the load current and therefore become the greatest portion of the total current consumption of the PWM amplifier.

In practice, an audio signal is rarely set at its maximum value, and is more typically at a much lower amplitude. As a result, most of the current consumption of the PWM amplifier is attributed to the static current consumed by the low pass filter. This static current is effectively wasted power and therefore diminishes the power efficiency of the PWM amplifier.

The relationship illustrated in FIG. 6 can be explained as follows.

First, the duty ratio of the PWM signal is defined as the ratio between the period of time when the PWM signal is at the logic HIGH state and the period of time when the PWM signal is at the logic LOW state. The amount of static current in the PWM amplifier depends on the duty ratio of the PWM signal. As the duty ratio approaches 1:1, the static current increases, and as the duty ratio increases in magnitude (e.g., 1:2, 1:3 . . . ), then the static current decreases.

FIG. 7 is a flowchart illustrating operation of the conventional PWM amplifier 200. As can be seen in FIG. 7, the conventional PWM amplifier 200 maintains the duty ratio of the PWM signal close to 1:1 regardless of the volume or magnitude of the audio signal, because the audio signal is alternating between (+) and (−) values. However, as shown in FIG. 7, there are some differences in the operation of conventional PWM amplifier 200 between when the volume of the audio signal is at a maximum value and when it is not at its maximum value. When the volume of audio signal is at a maximum value, then the PWM region is fully used by the audio signal and the amount of static current is negligible as compared with dynamic current. In contrast, when the volume of the audio signal is not at a maximum value, then a portion of the PWM region is unused by the audio signal, and the amount of static current is substantial as compared with dynamic current.

FIG. 8 illustrates signals in PWM amplifier 200 in the case where the volume of the audio signal is at a maximum value. In this case, it is seen that the total range of the PWM pulse width is used by the signal.

FIG. 9 illustrates signals in PWM amplifier 200 in the case where the volume of the audio signal is not at a maximum value. In this case, it is seen that the total range of the PWM pulse width is not used by the signal.

Although the relationship between static current and dynamic current in a PWM modulator has been explained in the context of an amplifier, and particularly an audio amplifier, in general the same relationship may apply in other devices employing a PWM modulator to modulate a signal, for example, a motor control system.

Accordingly, it would be advantageous to provide a method of PWM data processing which has a reduced static current. It would also be advantageous to provide an device or system that employs pulse width modulation which exhibits a reduced static current. Other and further objects and advantages will appear hereinafter.

In one aspect of the invention, a method of processing a signal comprises: adjusting an amplitude of an input signal according to an amplitude control signal; adding an offset to the amplitude-adjusted signal to produce an offset-adjusted signal, wherein the offset is selected according to the amplitude adjustment applied to the input signal; pulse-width modulating the offset-adjusted signal to produce a pulse-width modulated signal; and filtering the pulse-width modulated signal to reduce high frequency components thereof.

In another aspect of the invention, a method of processing an input signal comprises pulse-width modulating the input signal with a pulse-width modulator (PWM) to produce a PWM signal, and then filtering the PWM signal to reduce high frequency components of the pulse-width modulated signal, further comprising adjusting a duty ratio of the PWM signal in response to an amplitude control signal.

In yet another aspect of the invention, an audio processing system comprises: a volume control adapted to adjust a volume of an input signal in response to a volume control signal; an offset generator adapted to generate an offset to be applied to the volume-adjusted input signal, wherein the offset is selected in response to the volume control signal; a combiner adapted to apply the offset to the volume-adjusted input signal to produce an offset-adjusted signal; a pulse width modulator adapted to pulse-width modulate the offset-adjusted signal; and a filter adapted to reduce high frequency components of the pulse-width modulated signal.

In still another aspect of the invention, a motor control system comprises: an amplitude control adapted to adjust an amplitude of an input signal in response to an amplitude control signal; an offset generator adapted to generate an offset to be applied to the amplitude-adjusted input signal, wherein the offset is selected in response to the amplitude control signal; a combiner adapted to apply the offset to the amplitude-adjusted input signal to produce an offset-adjusted signal; a pulse width modulator adapted to pulse-width modulate the offset-adjusted signal; and a filter adapted to reduce high frequency components of the pulse-width modulated signal.

In a further aspect of the invention, a system adapted to process an input signal with a pulse-width modulator (PWM) to produce a PWM signal, and further adapted to filter the PWM signal to reduce high frequency components of the PWM signal, further comprises a duty-cycle adjustment element adapted to adjust a duty cycle of the PWM signal in response to an amplitude control signal.

DETAILED DESCRIPTION

Figure 10:
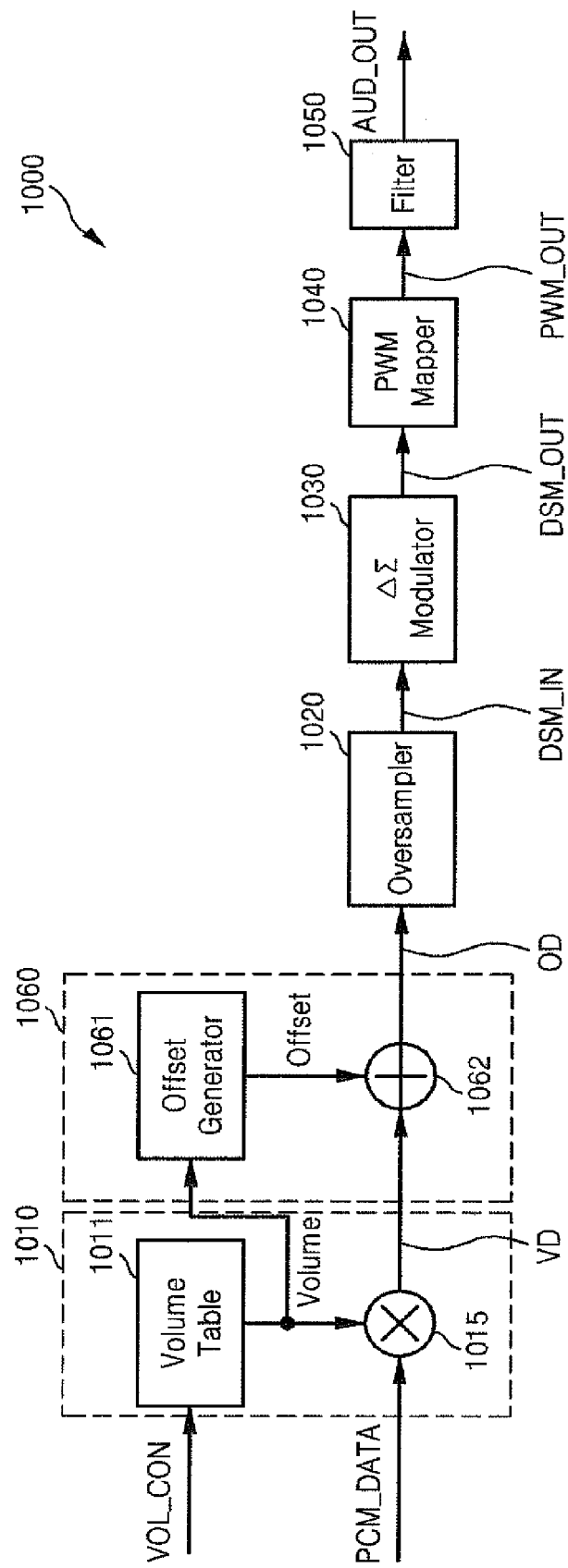
FIG. 10 is a functional block diagram of a first embodiment of a PWM amplifier.

FIG. 10 is a functional block diagram of a first embodiment of a PWM amplifier 1000. PWM Amplifier 1000 includes a volume control block 1010, an oversampler 1020, a Delta-Sigma modulator 1030, a PWM mapper 1040, a filter 1050, and an offset addition block 1060.

PWM amplifier 1000 receives at its input a digital audio signal as pulse-code modulated data PCM_DATA, and receives a volume control signal VOL_CON, and outputs an amplified output signal AUD_OUT.

Volume control block 1010 includes a volume table 1011 and a multiplier 1015. Volume table 1011 stores in a memory volume data VOL_DATA corresponding to each value of VOL_CON. VOL_DATA is a digital code (e.g. if VOL_CON is 4-bit data→Volume Table stores 16 values for VOL_DATA). In operation, volume table 1011 receives the volume control signal VOL_CON and in response thereto generates a corresponding value for VOL_DATA which it outputs as the VOLUME. The value of the VOLUME is then applied to multiplier 1015 in order to adjust the level of PCM_DATA to output a volume-controlled audio signal VD.

Offset addition block 1060 includes an offset generator 1061 and an offset combiner 1062. In one embodiment, offset generator 1061 stores in a memory (e.g., in a table) offset data OFFSET_DATA corresponding to each value of the VOLUME output by Volume Table 1011. OFFSET_DATA is a digital code (e.g. if Volume is 4-bit data→offset generator 1061 stores 16 values for OFFSET_DATA). In operation, offset generator 1061 receives the VOLUME and in response thereto generates a corresponding value for OFFSET_DATA which it outputs as the Offset. The value of OFFSET is then applied to combiner 1062 in order to adjust the level of PCM_DATA to output an offset-adjusted volume-controlled audio signal OD.

As will be explained in greater detail below, the value of OFFSET is chosen so that, when the volume of the audio signal is not at a maximum value, then the duty cycle of the audio signal is increased so as to increase the operating efficiency of PWM amplifier 1000.

Figure 3:
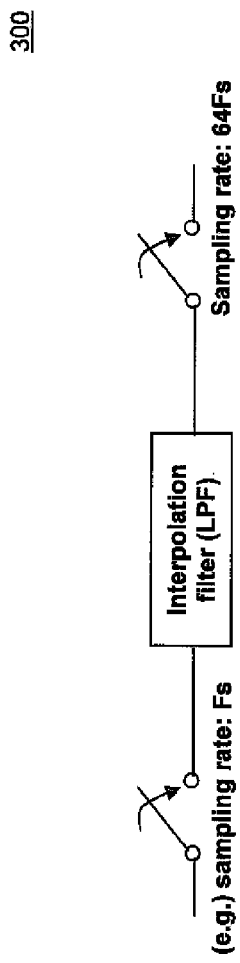
FIG. 3 illustrates a block diagram of one embodiment of an oversampler.

FIG. 3 illustrates a block diagram of oversampler 300 which is one possible embodiment of oversampler 1020. Oversampler 1020 oversamples the offset-adjusted volume-controlled audio signal OD which is the output by offset addition block 1060 and outputs an oversampled signal DSM_IN.

Figure 4:
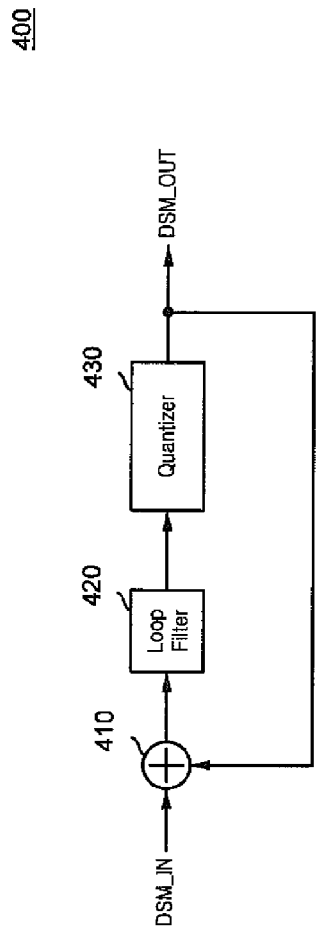
FIG. 4 illustrates a block diagram of one embodiment of a Delta Sigma Modulator.

FIG. 4 illustrates a block diagram of Delta Sigma Modulator 400 which is one possible embodiment of Delta Sigma Modulator 1030. Delta Sigma Modulator 1030 quantizes the oversampled signal DSM_IN to produce an output signal DSM_OUT having a fewer number of bits.

Figure 5:
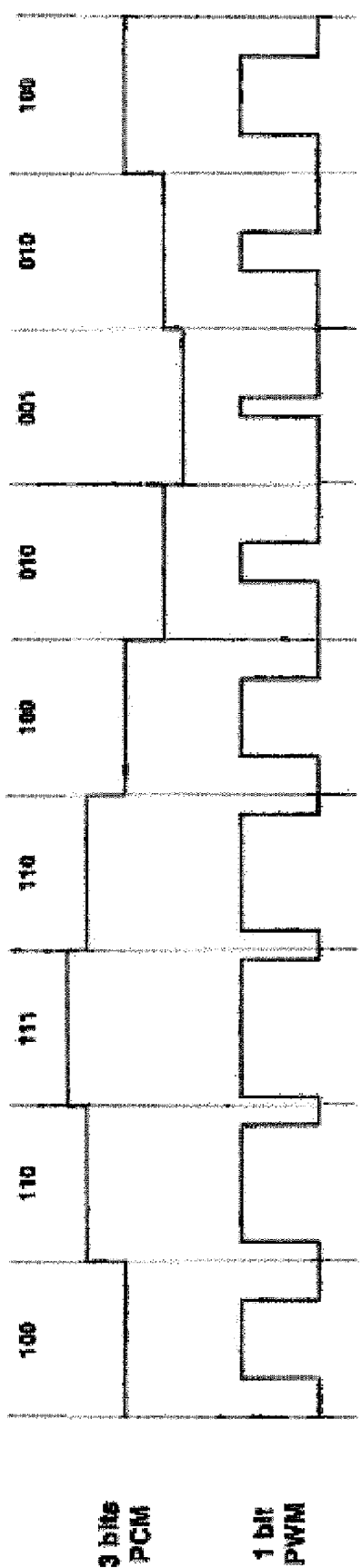
FIG. 5 illustrates an operation of PWM mapper in the case where a three-bit PCM signal is converted to a one-bit PWM signal.

PWM mapper 1040 converts a received PCM signal to an output PWM signal. PWM mapper 1040 modulates the width of the pulse in the PWM signal in proportion to the amplitude of the input signal. FIG. 5 illustrates an operation of PWM mapper 1040 in the case where a three-bit PCM signal is converted to a one-bit PWM signal.

Low Pass Filter (LPF) 1050 is a filter that passes low frequency signals (i.e., the required amplified signal) and removes unwanted spectral components (i.e., signals at the pulse frequency). Beneficially, LPF 1050 is made with theoretically lossless components like inductors and capacitors.

In FIG. 10, PCM_DATA, VD, OD, DSM_IN, DSM_OUT, PWM_OUT are all digital signals. PCM_DATA, VD, OD, DSM_IN, and DSM_OUT are all PCM signals, and PWM_OUT is a PWM signal. AUD_OUT is an analog signal.

Figure 11:
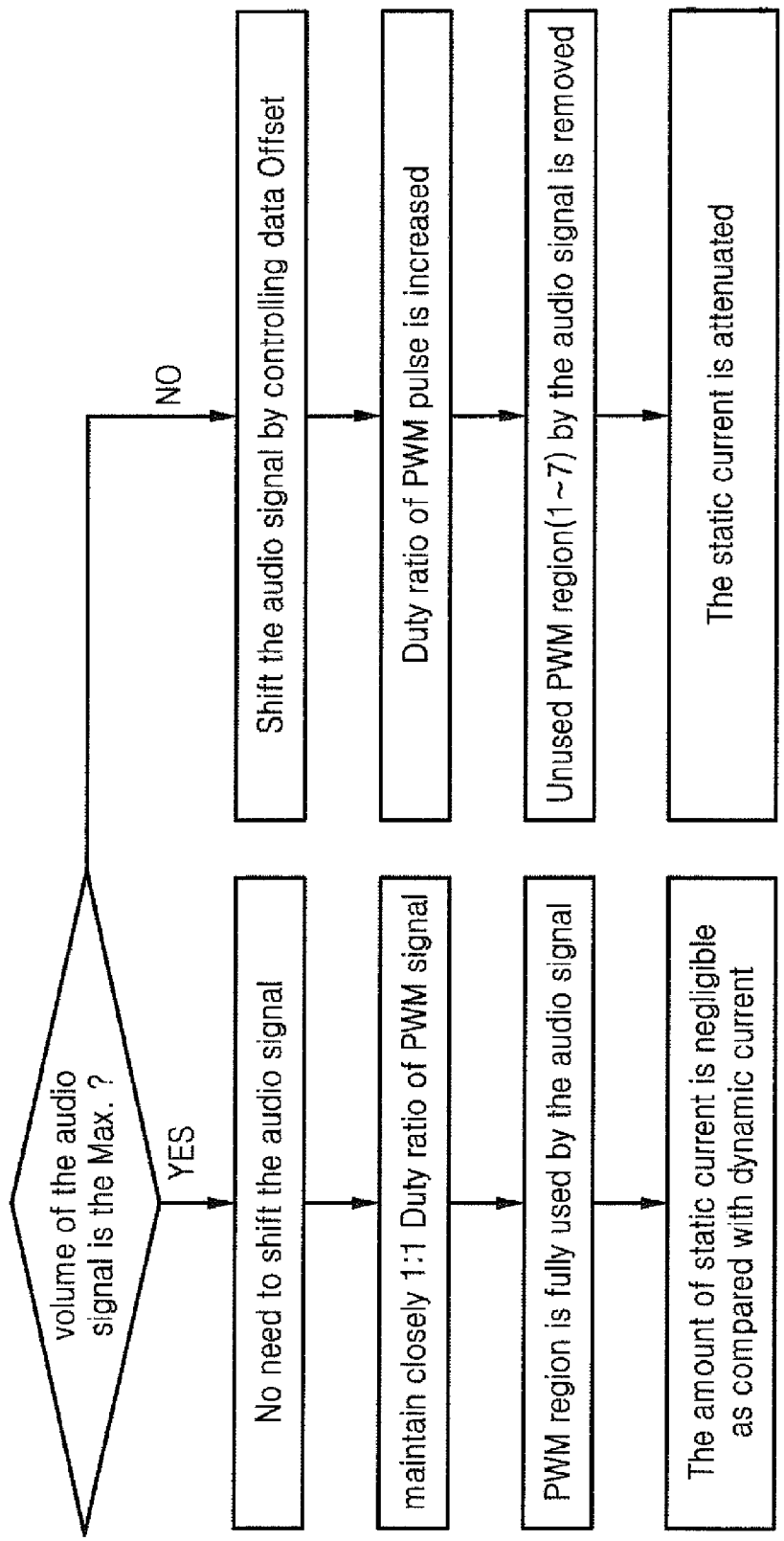
FIG. 11 is a flowchart illustrating operation of the PWM amplifier of FIG. 10.

FIG. 11 is a flowchart illustrating operation of the PWM amplifier 1000 of FIG. 10. As seen in FIG. 11, there are some differences in the operation of PWM amplifier 1000 between when the volume of the audio signal is at a maximum value and when it is not at its maximum value. When the volume of audio signal is at a maximum value, then the PWM region is fully used by the audio signal and the amount of static current is negligible as compared with dynamic current. In contrast, when the volume of the audio signal is not at a maximum value, then the audio signal is shifted by an OFFSET value so as to remove a portion of the PWM region comprising smaller PWM values (e.g., values 1-7) that would otherwise be unused. Accordingly, the duty cycle of the PWM audio signal is increased and the static current is decreased.

Figure 12:
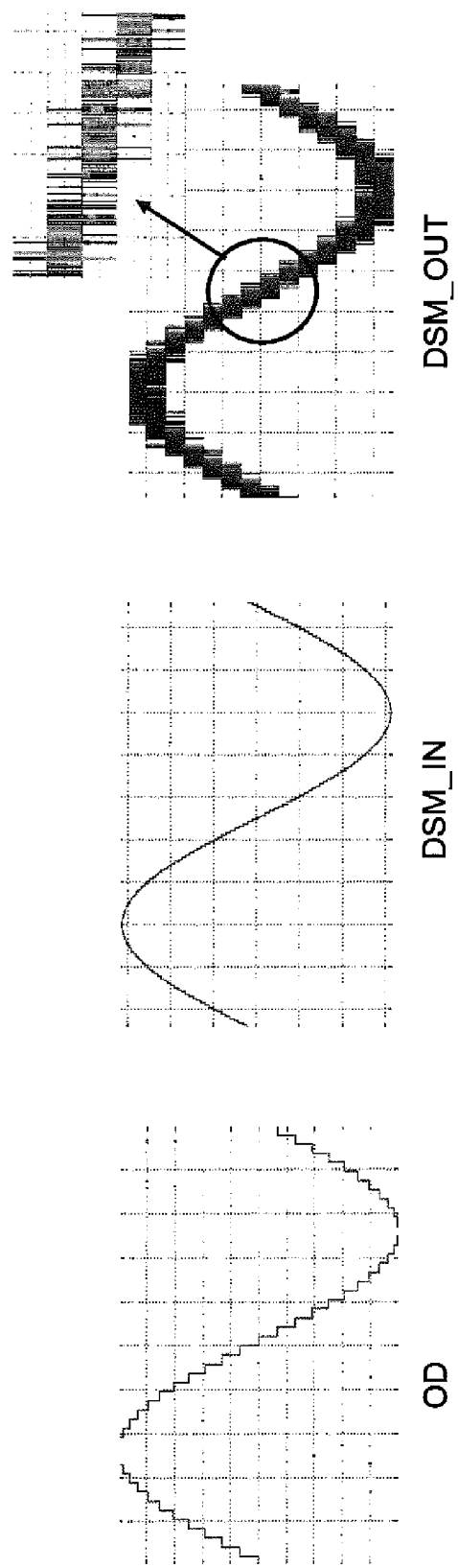
FIG. 12 illustrates exemplary signals in the PWM amplifier of FIG. 10.

FIG. 12 is a diagram illustrating exemplary signals in the PWM amplifier 1000 of FIG. 10. In particular, FIG. 12 shows an exemplary 16-bit OD signal at 48 kHz, an exemplary oversampled 16-bit DSM_IN signal at 64*48 kHz, and an exemplary delta-sigma modulated oversampled 4-bit DSM_IN signal at 64*48 kHz.

Figure 13:
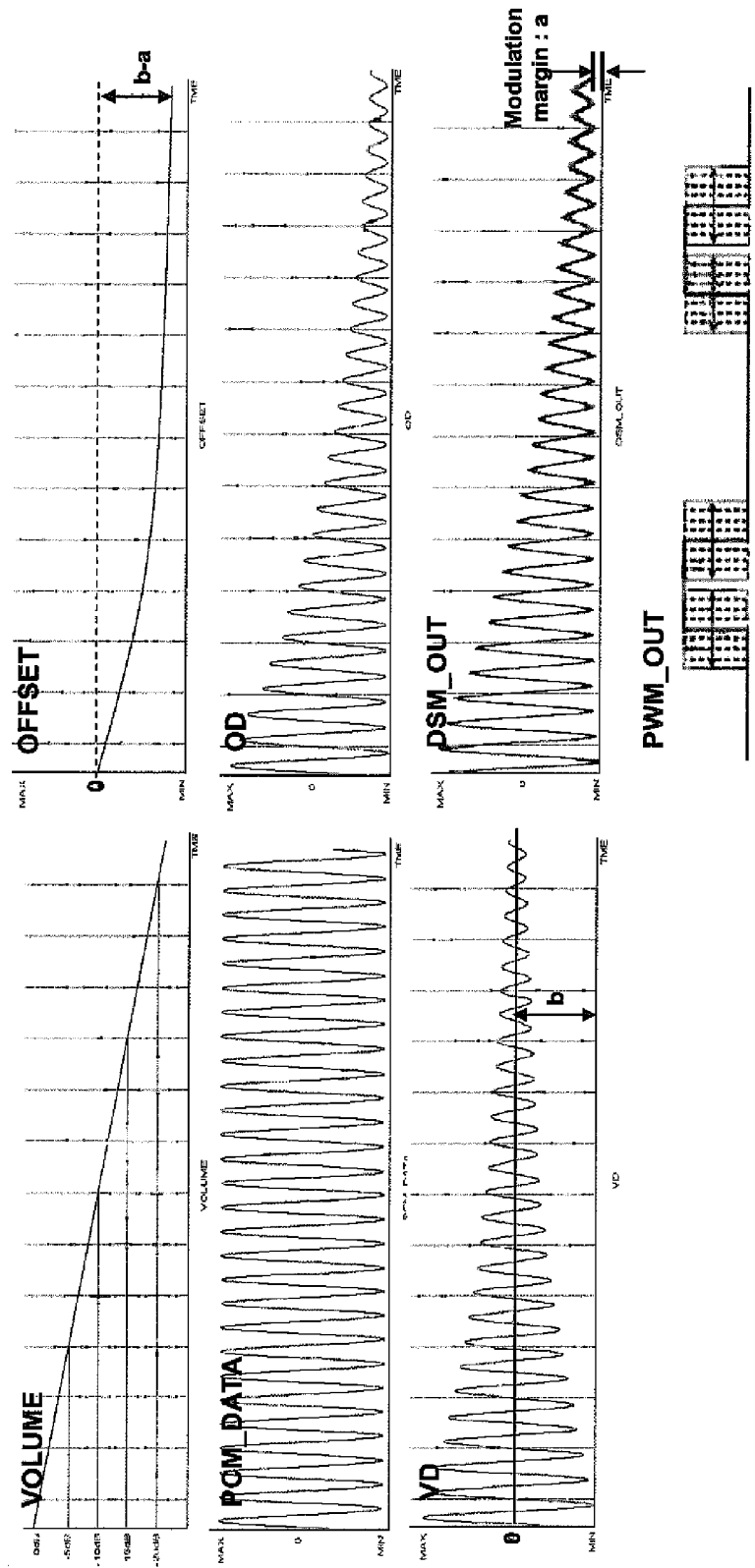
FIG. 13 illustrates how various signals in the PWM amplifier of FIG. 10 vary as a function of volume.

FIG. 13 illustrates how various signals in the PWM amplifier 1000 of FIG. 10 are varied as the VOLUME is changed for an exemplary PCM_DATA input signal. As can be seen in FIG. 13, as the VOLUME decreases from it maximum value (e.g., 0 dB) to lower values (e.g., −20 dB), then the amplitude of the volume-controlled signal VD is reduced, but the duty cycle is maintained at 1:1. In order to increase the duty ratio of the audio signal to decrease the static current in PWM amplifier 100, as the VOLUME decreases from it maximum value (e.g., 0 dB) to lower values (e.g., −20 dB) offset addition block 1060 adjusts the OFFSET value from 0 toward a minimum OFFSET value (b−a), where b is one half of the dynamic range of the volume-controlled signal VD, and a is a modulation margin that insures that the audio signal does not fold back upon itself and become distorted. The OFFSET is added to the volume-controlled signal VD to produce the offset-adjusted signal OD shown in FIG. 13. After oversampling and delta-sigma modulation, the input signal to the PWM mapper 1040 is DSM_OUT as shown in FIG. 13

Figure 14:
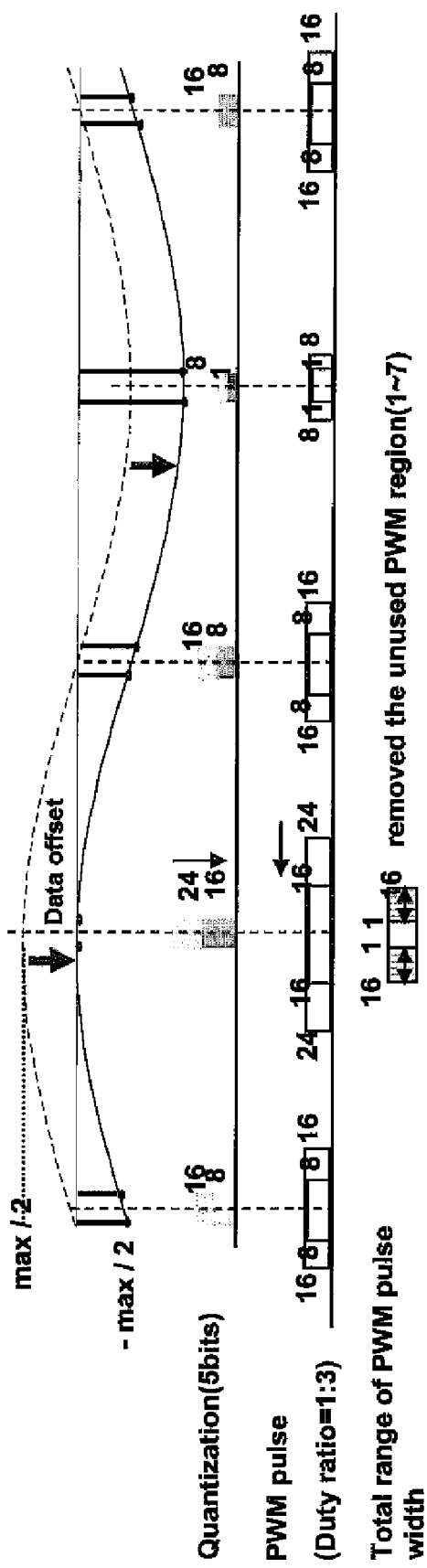
FIG. 14 illustrates exemplary signals in the PWM amplifier of FIG. 10 in the case where the input signal is not at a maximum value.

FIG. 14 illustrates exemplary signals in the PWM amplifier of FIG. 10 in the case where the input signal is not at a maximum value. FIG. 14 shows how an unused PWM region in the range 1-7 is removed as a result of the OFFSET being added to the volume-controlled audio signal. In the example illustrated in FIG. 14, the volume is adjusted so that the audio signal ranges from (−max/2) to (+max/2), in which case the duty ratio is adjusted to be 1:3.

Figure 1:
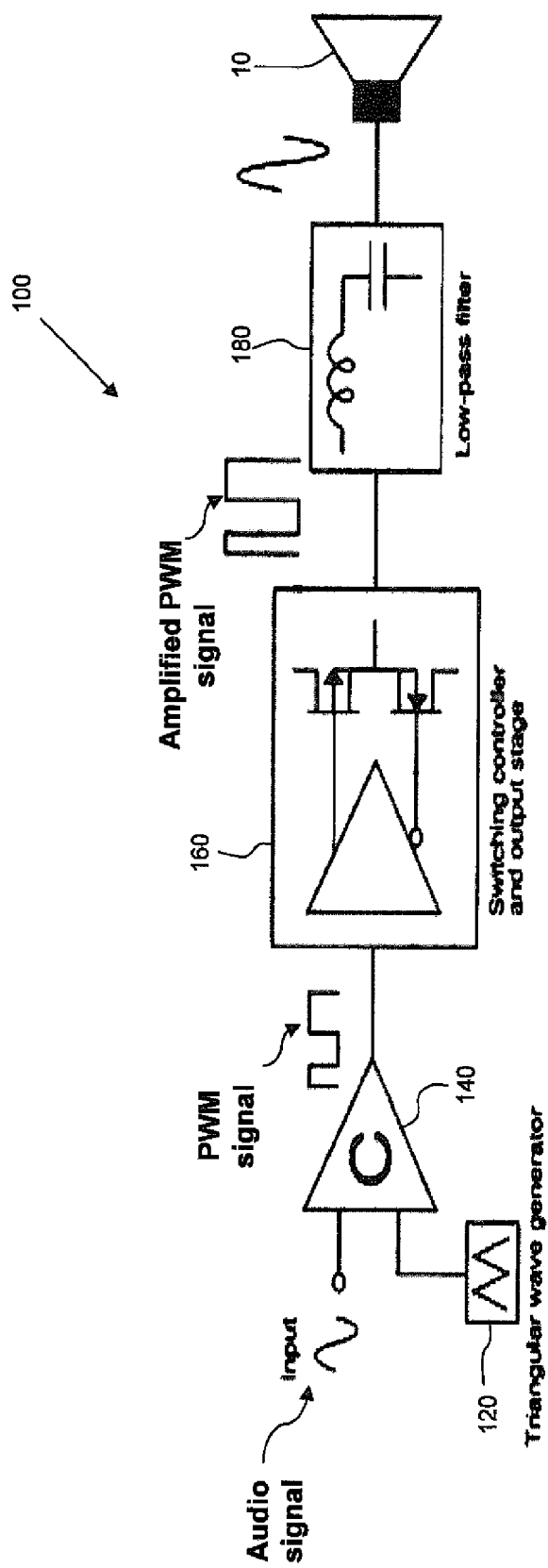
FIG. 1 shows a block diagram of one embodiment of a class-D amplifier.
Figure 2:
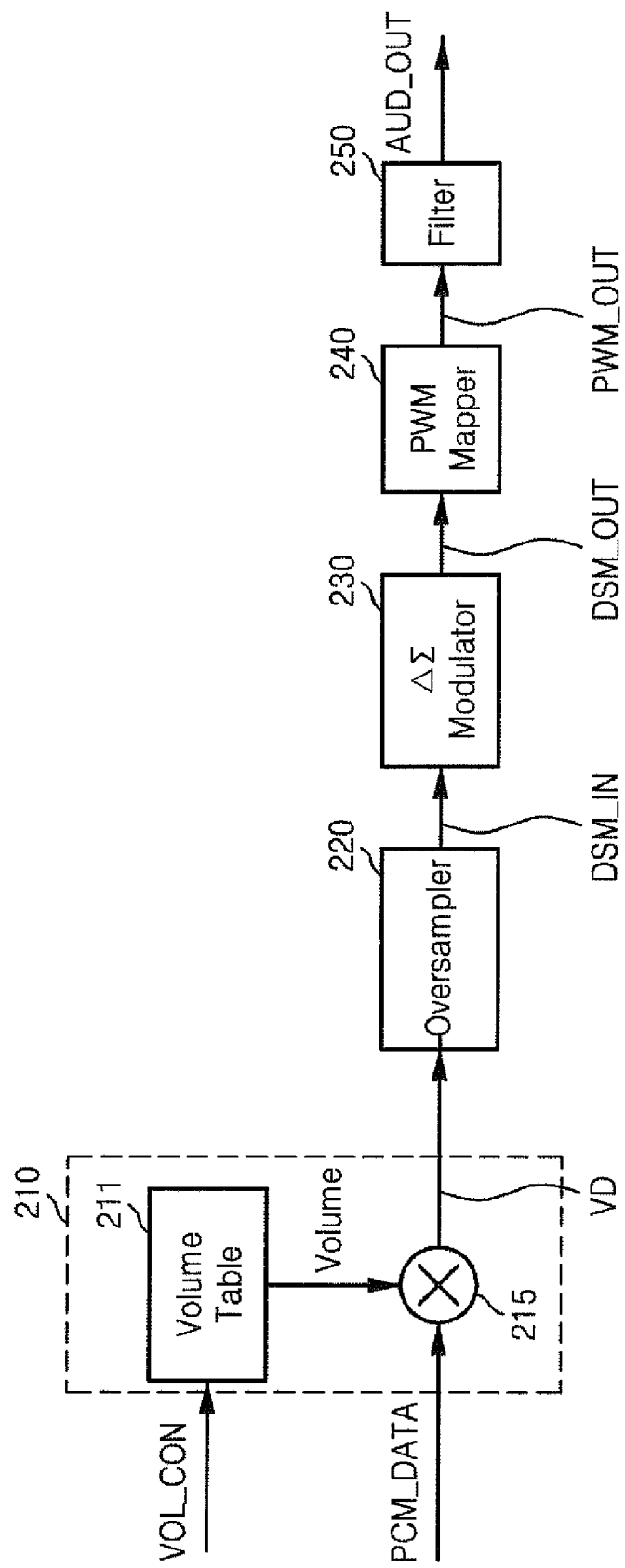
FIG. 2 is a functional block diagram of another embodiment of a pulse width modulation (PWM) amplifier.
Figure 15:
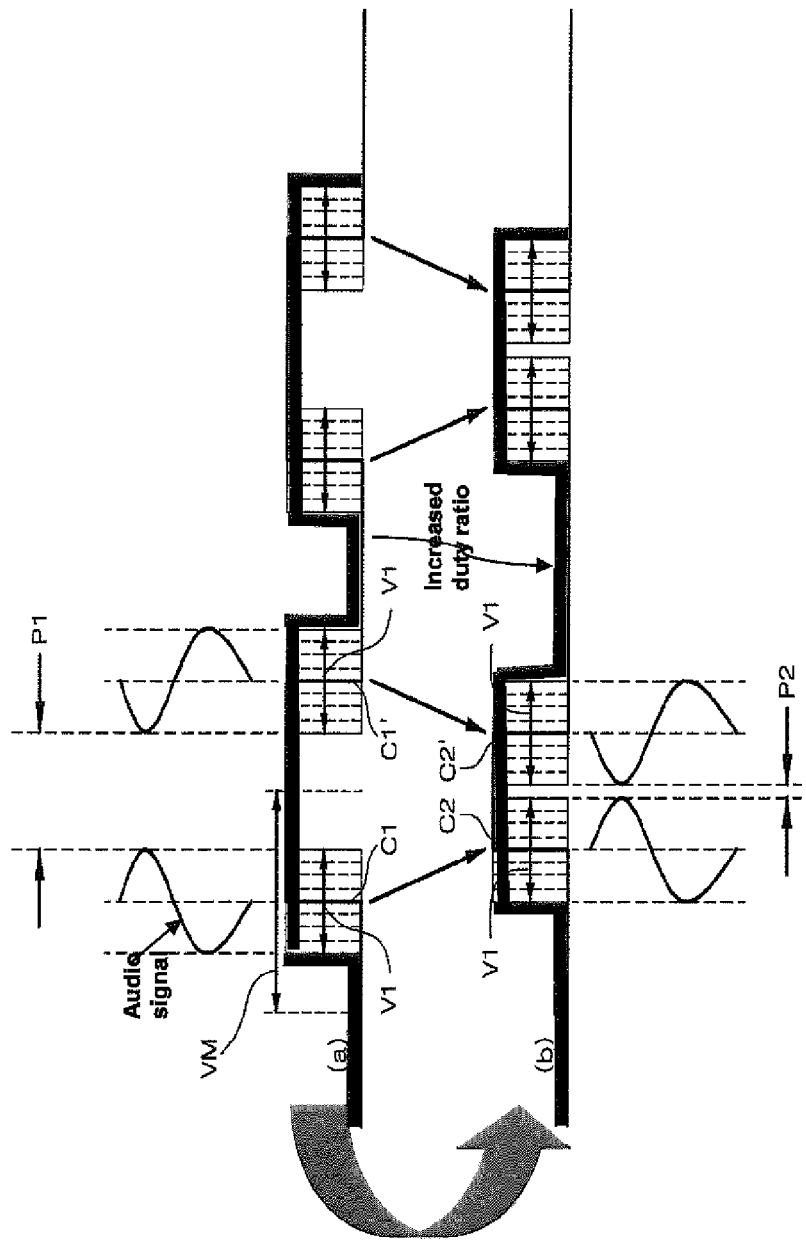
FIG. 15 illustrates some operating principles of the PWM amplifier of FIG. 10.

FIG. 15 illustrates some operating principles of a PWM amplifier of FIG. 10. In FIG. 15, the volume of the audio signal is set at a value below its maximum. The signals on line (a) in FIG. 15 correspond to an example where an offset has not been applied, as in the conventional art PWM amplifier 200 of FIG. 2, and the signals on line (b) correspond to an example where an offset has been applied to the audio signal, as in PWM amplifier 1000 in FIG. 10. In FIG. 15: V1 represents the range of PWM pulse width fluctuations when the volume of the audio signal is set at a value below its maximum; VM represents the range of PWM pulse width fluctuations when the volume of the audio signal is at its maximum value; C1/C1' and C2/C2' indicate the centers of the peak-to-peak swing for the audio signals on line (a) (conventional art with no offset) and line (b) (PWM amplifier with offset), respectively; and P1, P2 indicate unused PWM regions for the audio signals on line (a) and line (b), respectively.

Figure 16:
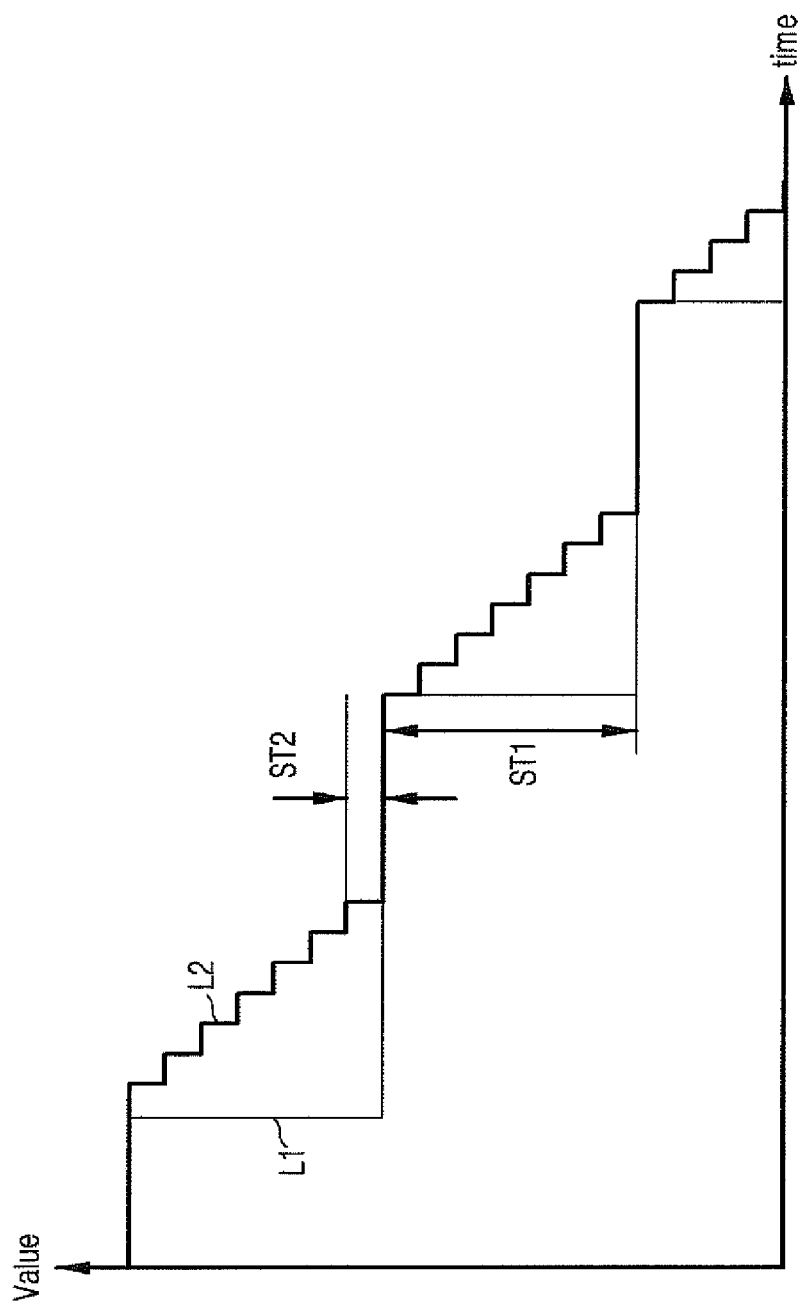
FIG. 16 illustrates one variation in operation of the PWM amplifier of FIG. 10.

FIG. 16 illustrates one variation in operation of the PWM amplifier of FIG. 10. When the OFFSET value changes dramatically according to a change in the VOLUME, the change in the PWM pulse width results in a "tic-noise." To reduce this tic-noise, beneficially the minimum step (ST2) in the value of the OFFSET is made smaller than the minimum step (ST1) in the value of the VOLUME. Accordingly, as shown in FIG. 16, if the VOLUME is changed by one step, the OFFSET is controlled to change in multiple steps. Beneficially, in one embodiment his feature of controlling the minimum step of the OFFSET can be provided to offset addition block 1060.

Figure 17:
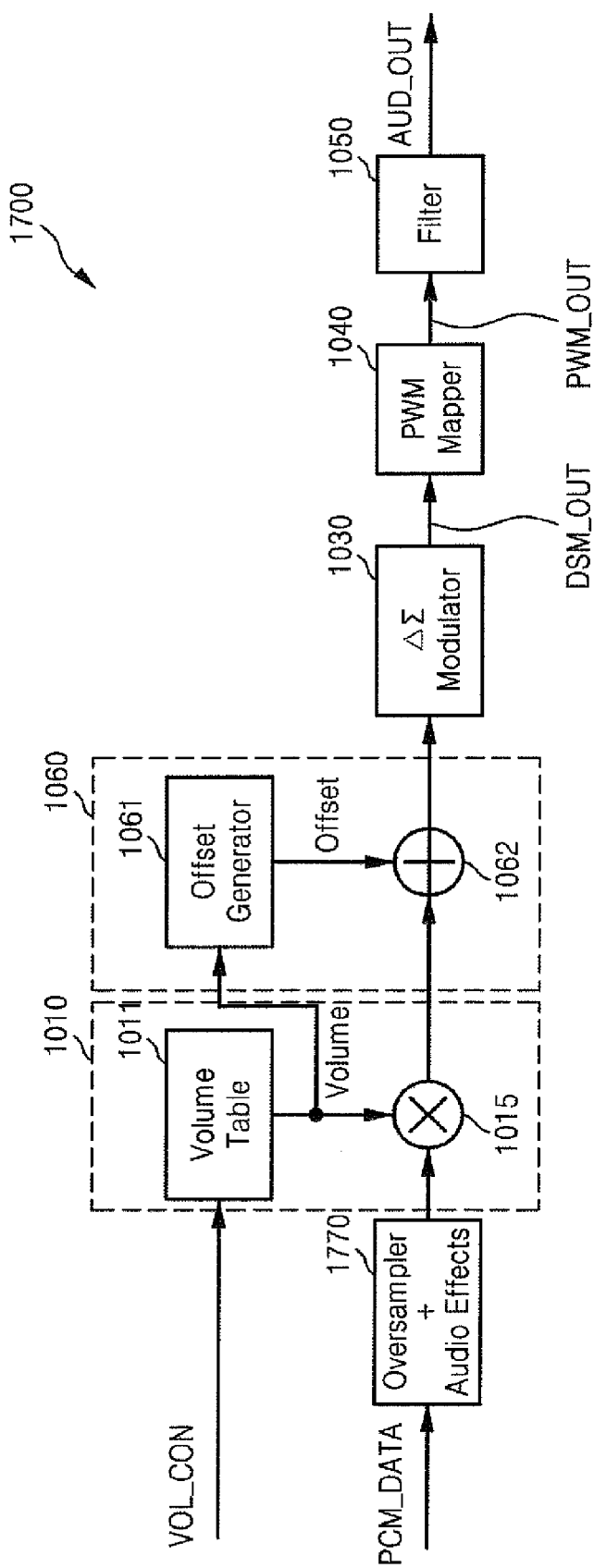
FIG. 17 is a functional block diagram of a second embodiment of a PWM amplifier.

FIG. 17 is a functional block diagram of a second embodiment of a PWM amplifier 1700. PWM amplifier 1700 is similar to PWM amplifier 1000 of FIG. 10, and so for the sake of brevity, only the differences will be explained here. Whereas PWM amplifier 1000 includes oversampler 1020 following offset addition block 1060, PWM amplifier 1700 includes instead oversampler and audio effects block 1770 preceding volume control block 1010.

Figure 18:
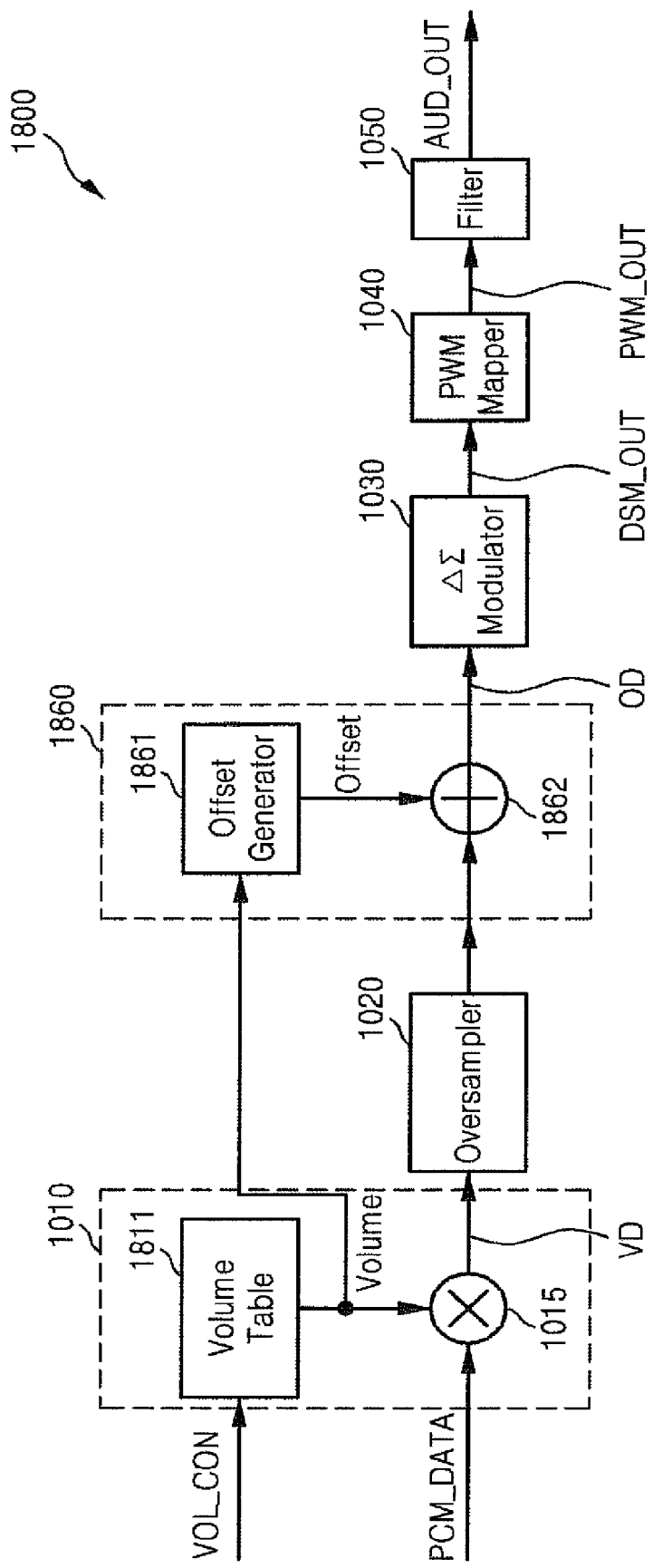
FIG. 18 is a functional block diagram of a third embodiment of a PWM amplifier.

FIG. 18 is a functional block diagram of a third embodiment of a PWM amplifier 1080. PWM amplifier 1800 is similar to PWM amplifier 1000 of FIG. 10, and so for the sake of brevity, only the differences will be explained here. Whereas PWM amplifier 1000 includes offset addition block 1060 following volume control block 1010, PWM amplifier 1800 includes instead offset addition block 1060 following oversampler 1020.

Figure 6:
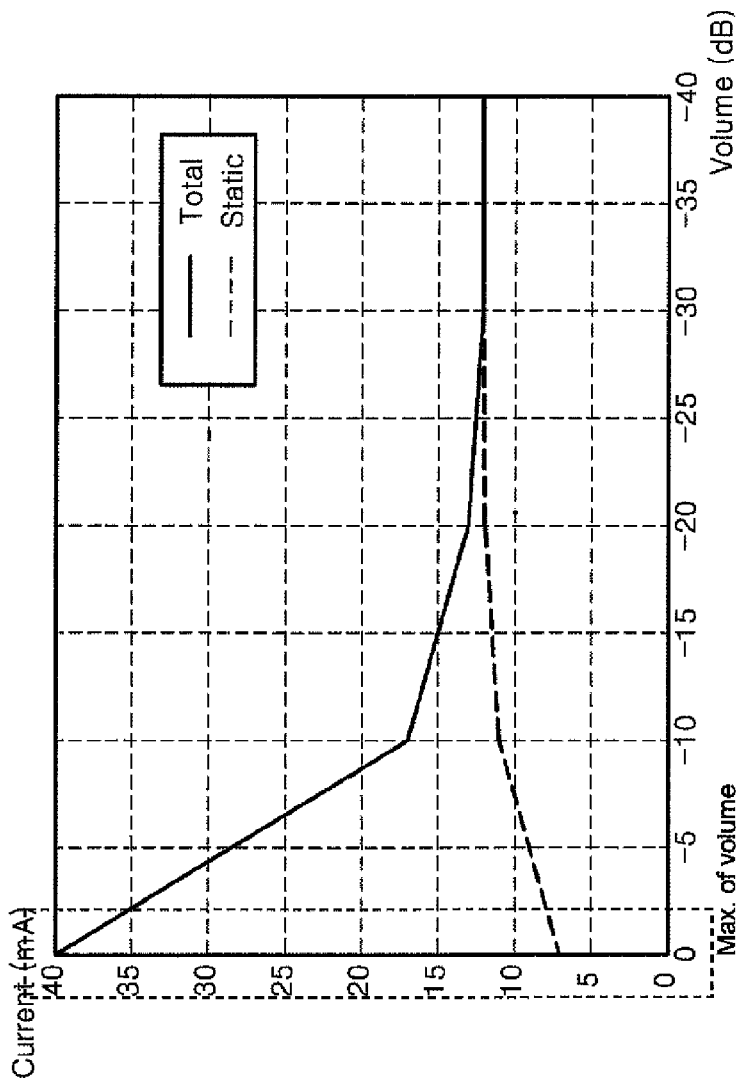
FIG. 6 illustrates the relationship between the static current and the total current consumption in the conventional PWM amplifier.
Figure 7:
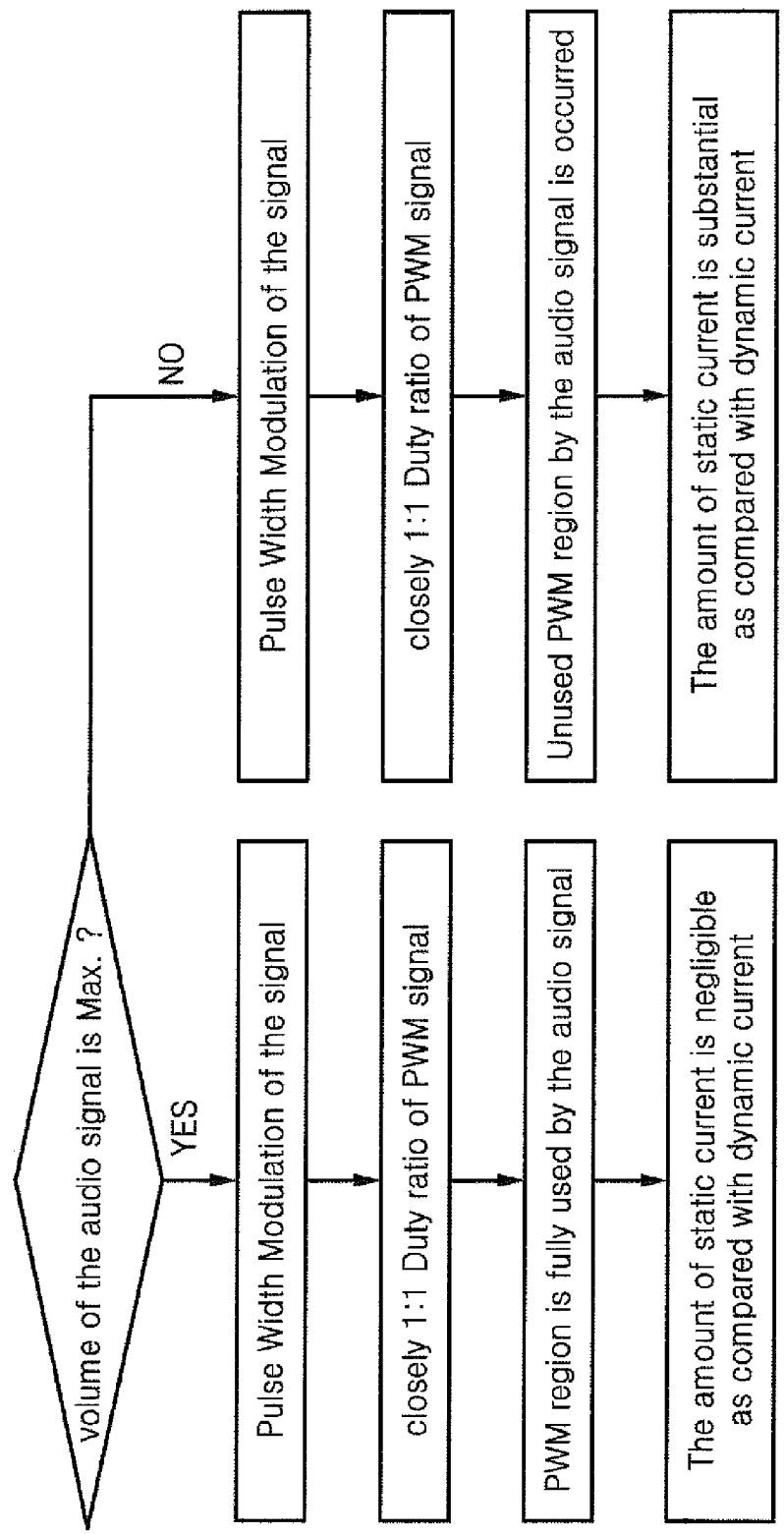
FIG. 7 is a flowchart illustrating operation of a conventional PWM amplifier.
Figure 8:
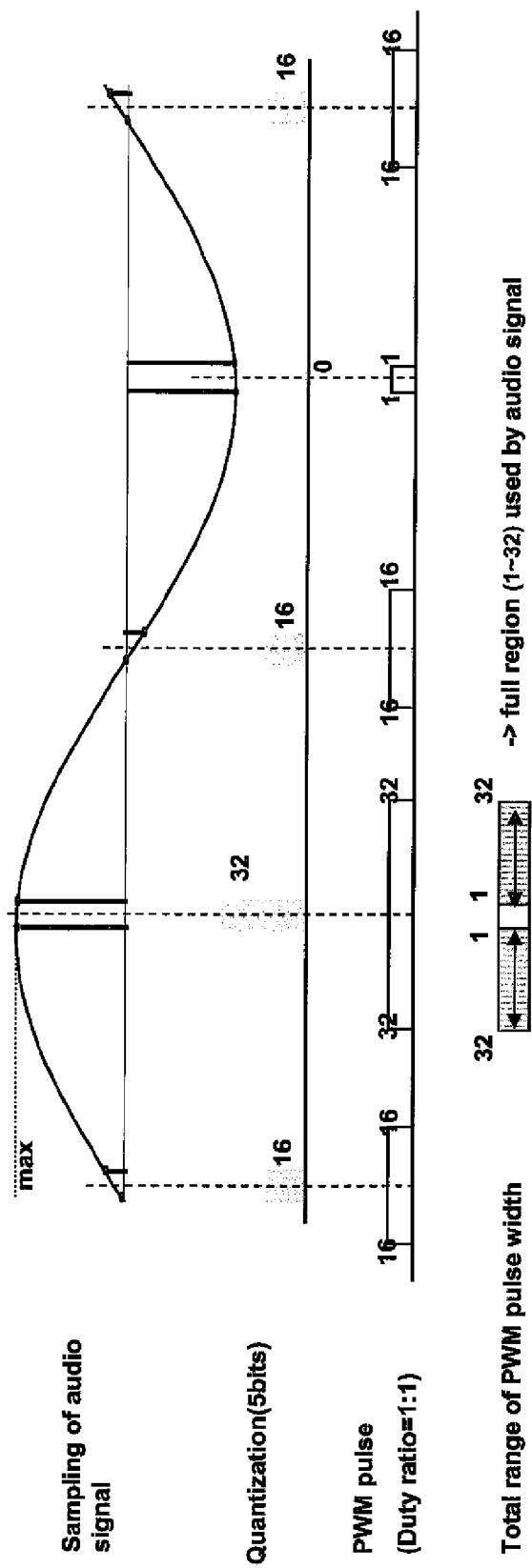
FIG. 8 illustrates signals in a conventional PWM amplifier in the case where the volume of an audio signal is at a maximum value.
Figure 9:
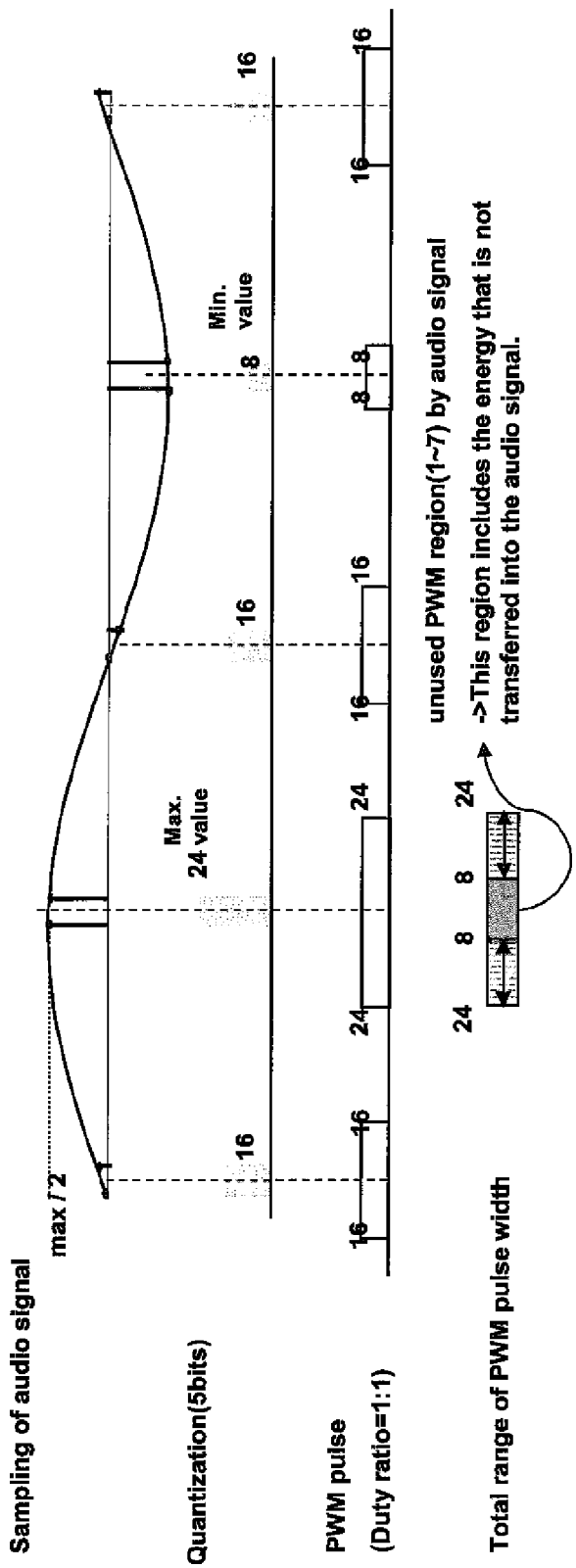
FIG. 9 illustrates signals in a conventional PWM amplifier in the case where the volume of an audio signal is not at a maximum value.
Figure 19:
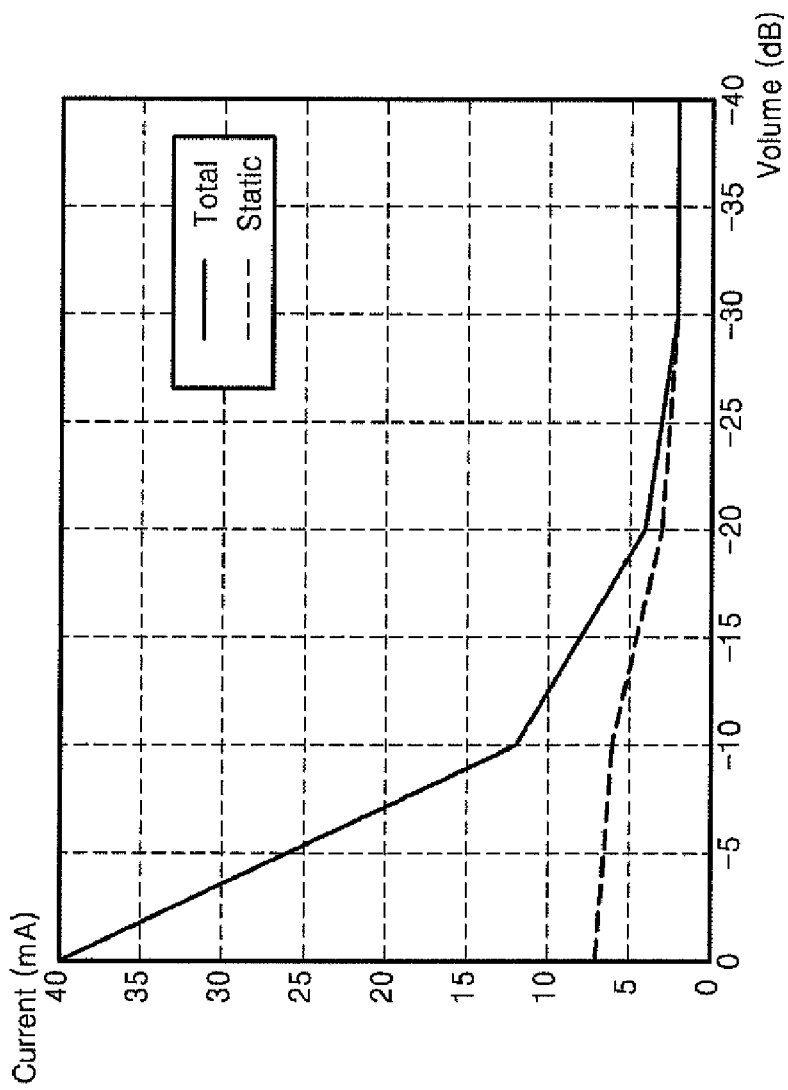
FIG. 19 illustrates the relationship between the static current and the total current consumption in the PWM amplifiers of FIGS. 10, 17 and 18.

FIG. 19 illustrates the relationship between the static current and the total current consumption in the PWM amplifiers of FIGS. 10, 17 and 18. As can be seen in FIG. 19, when the amplitude of the signal (i.e., the volume of an audio signal) is at its maximum value, then the load current (i.e. the dynamic current) which is passed by the low pass filter and transferred to the load (i.e., the loudspeaker) is the greatest portion of the total current consumption of the amplifier. As the amplitude (volume) of the audio signal decreases, then the dynamic (load) current decreases. However, in contrast to the conventional PWM amplifier performance illustrated in FIG. 6, in the PWM amplifiers 1000, 1700 and 1800, the static current consumed in the low pass filter also decreases when the amplitude (volume) of the audio signal decreases, dues to the OFFSET value added to the audio signal. As a result, at volume levels that are less than the maximum volume, the total current consumption of the PWM amplifiers 1000, 1700 and 1800 is reduced compared to the total current consumption of PWM amplifier 200.

Although the principles of adding an OFFSET to a signal in a PWM modulator have been explained in the context of an amplifier, and particularly an audio amplifier, in general the same principles may apply in other devices employing a PWM modulator to modulate a signal, for example, a motor control system.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

I claim:
1. A method, comprising:
receiving a pulse code modulated (PCM) audio signal in an amplifier circuit;
adjusting the PCM audio signal in response to a volume control signal to generate a PCM volume-controlled audio signal;
generating an offset value in response to the volume control signal;
combining the offset value with the PCM volume-controlled audio signal to generate an offset-adjusted volume-controlled PCM audio signal;
pulse-width modulating the offset-adjusted volume-controlled PCM audio signal to generate a pulse-width modulated signal; and
filtering the pulse-width modulated signal to generate an analog audio output signal output by the amplifier circuit.

2. The method of claim 1, wherein adjusting the PCM audio signal comprises multiplying the PCM audio signal by a scaling factor selected according to the volume control signal.

3. The method of claim 2, further comprising applying the volume control signal to a scaling factor look-up table to select the scaling factor from the look-up table.

4. The method of claim 3, further comprising applying the scaling factor to an offset generator to generate the offset value.

5. The method of claim 4, further comprising applying the scaling factor to an offset value look-up table to select the offset value from a plurality of offset values stored in the offset value look-up table.

6. The method of claim 5, wherein the offset value look-up table maps the scaling factor to the offset value according to a logarithmic function.

7. The method of claim 1, wherein generating the offset value comprises applying the volume control signal to an offset generator to generate the offset value.

8. The method of claim 1, wherein generating the offset value comprises applying the volume control signal to an offset value look-up table to select the offset value from a plurality of offset values stored in the offset value look-up table.

9. The method of claim 1, wherein as the volume control signal is changed, for each one of a plurality of offset adjustment periods less than one sample period for the PCM audio signal, the offset value changes less than the change in the volume control signal.

10. The method of claim 1, further comprising oversampling the PCM audio signal prior to adjusting the PCM audio signal in response to the volume control signal.

11. The method of claim 1, further comprising oversampling the PCM volume-controlled audio signal prior to combining the offset value with the PCM volume-controlled audio signal.

12. The method of claim 1, wherein combining the offset value with the PCM volume-controlled audio signal comprises adding the offset value to the PCM volume-controlled audio signal.

13. The method of claim 1, further comprising
oversampling the PCM volume-controlled audio signal; and
reducing a quantization of the oversampled PCM volume-controlled audio signal to reduce a number of bits per sample.

14. The method of claim 1, wherein adjusting the PCM audio signal comprises selecting volume data from a volume table using the volume control signal and combining the volume data with the PCM audio signal.

15. The method of claim 1, wherein combining the offset value with the PCM volume-controlled audio signal comprises adding a DC offset voltage to the PCM volume-controlled audio signal.

16. The method of claim 15, wherein the DC-offset voltage is adjusted in response to the PCM volume-controlled audio signal according to a logarithmic function.

17. The method of claim 8, wherein the plurality of offset values includes a maximum value defining magnitude for the PCM volume-controlled audio signal less than a maximum magnitude of the PCM audio signal.

18. A method of processing an input signal in an amplifier circuit, the method comprising:
pulse-width modulating the input signal received in the amplifier circuit using a pulse-width modulator (PWM) to generate a PWM signal;
filtering the PWM signal to reduce high frequency components;
adjusting a duty ratio of the PWM signal in response to an amplitude control signal by increasing the duty ratio of the PWM signal to be greater than 1:1 when the amplitude control signal is less than a defined maximum value, and
providing an output signal derived from the duty ratio-adjusted PWM signal from the amplifier circuit.

19. The method of claim 18, wherein the duty cycle of the PWM signal is adjusted in response to the amplitude control signal according to a logarithmic function.

20. A method of processing an input audio signal in an amplifier circuit receiving a volume control signal, the method comprising:
pulse-width modulating the input audio signal using a pulse-width modulator (PWM) to generate a PWM audio signal;
filtering the PWM audio signal to reduce high frequency components; and
adjusting a duty ratio of the PWM audio signal by applying an offset to the input audio signal selected in response to the volume control signal.

21. The method of claim 20, further comprising adjusting an amplitude of the input audio signal in response to the volume control signal before adjusting the duty ration of the PWM audio signal.

22. The method of claim 21, wherein the input audio signal is a pulse code modulated (PCM) signal.

23. The method of claim 22, wherein adjusting the amplitude of the input audio signal comprises multiplying the PCM signal by a scaling factor selected according to the volume control signal.

24. The method of claim 23, further comprising applying the volume control signal to select the scaling factor from a plurality of scaling factors stored in a look-up table.

25. The method of claim 24, further comprising applying the scaling factor to an offset generator to produce an offset value.

26. The method of claim 24, further comprising applying the scaling factor to an offset value look-up table to produce an offset value.

27. The method of claim 22, further comprising applying the volume control signal to an offset generator to produce an offset value.

28. The method of claim 22, further comprising applying the volume control signal to an offset value look-up table to produce an offset value.

29. The method of claim 22, wherein as the volume control signal is changed, for each one of a plurality of offset adjustment periods less than one sample period for the PCM audio signal, the offset value changes less than the change in the volume control signal.

30. The method of claim 22, further comprising oversampling the input audio signal prior to adjusting the amplitude of the input audio signal.

31. The method of claim 22, further comprising oversampling the input audio signal after adjusting the amplitude of the input audio signal.

32. The method of claim 22, further comprising oversampling the amplitude-adjusted signal prior to applying the offset.

33. The method of claim 22, further comprising oversampling the amplitude-adjusted signal after applying the offset and prior to pulse-width modulation.

34. The method of claim 22, further comprising:
oversampling the input signal; and
reducing a quantization of the oversampled signal to reduce a number of bits per sample.

35. The method of claim 20, wherein the input audio signal is an analog signal.

36. The method of claim 22, wherein applying the offset to the input audio signal comprises applying a DC-offset voltage to the amplitude-adjusted version of the input audio signal.

* * * * *